US010060995B2

(12) United States Patent
Stainsby et al.

(10) Patent No.: US 10,060,995 B2
(45) Date of Patent: Aug. 28, 2018

(54) MAGNETIC RESONANCE IMAGING SYSTEM CAPABLE OF RAPID FIELD RAMPING

(71) Applicant: SYNAPTIVE MEDICAL (BARBADOS) INC., Bridgetown (BB)

(72) Inventors: Jeff A. Stainsby, Toronto (CA); Chad T. Harris, Toronto (CA); Alexander G. Panther, Toronto (CA); Cameron A. Piron, Toronto (CA)

(73) Assignee: Synaptive Medical (Barbados) Inc., Bridgetown (BB)

( * ) Notice: Subject to any disclaimer, the term of this patent is extended or adjusted under 35 U.S.C. 154(b) by 0 days.

(21) Appl. No.: 15/128,881

(22) PCT Filed: Oct. 16, 2015

(86) PCT No.: PCT/IB2015/057979
§ 371 (c)(1),
(2) Date: Sep. 23, 2016

(87) PCT Pub. No.: WO2017/064539
PCT Pub. Date: Apr. 20, 2017

(65) Prior Publication Data
US 2017/0261574 A1 Sep. 14, 2017

(51) Int. Cl.
*G01R 33/3815* (2006.01)
*G01R 33/38* (2006.01)
(52) U.S. Cl.
CPC ..... *G01R 33/3815* (2013.01); *G01R 33/3804* (2013.01)

(58) Field of Classification Search
USPC ......... 324/300–322; 600/407–435; 174/15.4, 174/15.5; 335/299, 301, 216; 361/19
See application file for complete search history.

(56) References Cited

U.S. PATENT DOCUMENTS 3,297,860 A * 1/1967 Weiss ............... G01R 33/46
324/312
4,895,831 A * 1/1990 Laskaris ............ H01F 6/065
174/15.5

(Continued)

OTHER PUBLICATIONS

The International Search Report and Written Opinion dated May 16, 2015 for International Application PCT/US2015/057979.

*Primary Examiner* — Melissa Koval
*Assistant Examiner* — Tiffany Fetzner
(74) *Attorney, Agent, or Firm* — Quarles & Brady LLP

(57) ABSTRACT

Systems and methods for rapidly ramping the magnetic field of a superconducting magnet, such as a superconducting magnet adapted for use in a magnetic resonance imaging system, are provided. The magnetic field can be rapidly ramped up or down by changing the current density in the superconducting magnet while monitoring and controlling the superconducting magnet's temperature to remain below a transition temperature. A superconducting switch is used to connect the superconducting magnet and a power supply in a connected circuit. The current generated by the power supply is then adjusted to increase or decrease the current density in the superconducting magnet to respectively ramp up or ramp down the magnetic field strength in a controlled manner. The ramp rate at which the magnetic field strength is changed is determined and optimized based on the operating parameters of the superconducting magnet and the current being generated by the power supply.

15 Claims, 3 Drawing Sheets

(56) References Cited

U.S. PATENT DOCUMENTS

| | | | | |
|---|---|---|---|---|
| 4,902,995 | A | * | 2/1990 | Vermilyea .......... G01R 33/3815 174/15.4 |
| 4,924,198 | A | * | 5/1990 | Laskaris ............ G01R 33/3815 174/15.4 |
| 4,935,714 | A | * | 6/1990 | Vermilyea .......... G01R 33/3815 324/318 |
| 5,329,165 | A | * | 7/1994 | Kao .................... H05K 9/0077 307/104 |
| 5,675,305 | A | * | 10/1997 | DeMeester ........ G01R 33/3806 335/302 |
| 6,097,187 | A | * | 8/2000 | Srivastava ......... G01R 33/3815 324/319 |
| 6,128,174 | A | * | 10/2000 | Ritter ...................... A61N 2/02 361/141 |
| 6,977,571 | B1 | * | 12/2005 | Hollis .................. G01R 33/288 324/319 |
| 7,298,602 | B2 | | 11/2007 | Knight |
| 8,027,139 | B2 | * | 9/2011 | Beier .................. G01R 33/288 361/141 |
| 8,542,015 | B2 | | 9/2013 | Lvovsky et al. |
| 2010/0284120 | A1 | * | 11/2010 | Beier .................. G01R 33/288 361/141 |
| 2014/0085021 | A1 | | 3/2014 | Blakes et al. |
| 2017/0261574 | A1 | * | 9/2017 | Stainsby ............ G01R 33/3815 |
| 2017/0263361 | A1 | * | 9/2017 | Mulder .................... H01F 6/04 |

* cited by examiner

MAGNETIC RESONANCE IMAGING SYSTEM CAPABLE OF RAPID FIELD RAMPING

CROSS-REFERENCE TO RELATED APPLICATIONS

This application represents the national stage entry of PCT International Application No. PCT/IB2015/057979 filed Oct. 16, 2015. The contents of this application are hereby incorporated by reference as if set forth in their entirety herein.

BACKGROUND OF THE INVENTION

The field of the invention is systems and methods for magnetic resonance imaging ("MRI"). More particularly, the invention relates to systems and methods for MRI in which the magnetic field of the MRI scanner can be rapidly ramped up and down as needed.

MRI systems typically utilize one of two types of magnet assemblies to generate the strong, main magnetic field used for imaging. One type generates the main magnetic field using permanent magnets. This type of system is less popular because the magnetic field strengths that can be achieved with such systems is limited. Moreover, these systems tend to be extremely heavy and are very sensitive to temperature fluctuations. Permanent magnets also cannot be turned off, so there is no way to remove the magnetic field.

The second type of MRI system generates the main magnetic field using a superconducting electromagnet. Using superconducting magnets allows high current densities through the conductors of the electromagnet without power dissipation, which in turn enables the ability to achieve high magnetic field strengths. For the magnet to be superconducting, the magnet coils must be cooled to extremely low temperatures (e.g., about 4 K).

One method used to cool the superconducting magnet coils to this low temperature is done by immersing the conductor in a liquid helium bath. These superconducting systems tend to be very expensive because of the high cost of the liquid cryogens (e.g., liquid helium). Furthermore, it is not easy to rapidly turn on or off the magnetic fields generated by these systems. For example, to rapidly turn off the magnetic field typically requires heating up the conductive magnet coils so that they develop resistance that can dissipate their stored energy. This resistance produces heat that causes the liquid cryogen, which is providing the cooling, to convert to rapidly expanding gas. This boiling-off of the liquid cryogen removes the cooling capability of the system, and thus the magnetic field generated by the magnet coils. But, the magnetic field cannot be regenerated until the liquid cryogen is replaced and the magnet coils are cooled back down to superconducting temperatures, a process that normally involves multiple days and significant expense.

Alternatively, current can be removed or added to superconducting magnet systems very slowly without causing enough heating to boil off the liquid cryogen. In these situations, it takes many hours to completely add or remove the current, making rapid turning the magnetic field on or off in this manner not feasible.

For safety reasons, it would be beneficial for an MRI scanner to be capable of having the magnetic field rapidly turned off. For example, large metallic objects being attracted by the strong magnetic field is one of the primary risks associated with these devices. Traditional superconducting magnets have implemented a mechanism to rapidly turn off the magnetic field in an emergency situation by "quenching" the magnet in the manner described above, where all liquid cryogens are boiled off very rapidly. Quenching the magnet, however, requires a time consuming and expensive replacement of the liquid cryogens and before the magnetic field can be reestablished.

The ability to rapidly ramp up and down the magnetic field of an MRI system without the significant expense of losing and replacing expensive liquid cryogens would be very useful for interventional and mobile imaging applications. In these situations, it would be advantageous to ramp down the magnetic field of the MRI system so it could be safely stored (e.g., in a surgical suite) or transported, while at the same time allowing for the magnetic field to be rapidly ramped up (e.g., within a matter of minutes) for use as needed.

SUMMARY OF THE INVENTION

The present invention overcomes the aforementioned drawbacks by providing systems and methods for rapidly ramping up or down the magnetic field generated by a superconducting magnet, such as a superconducting magnet adapted for use in a magnetic resonance imaging ("MRI") system.

It is thus one aspect of the invention to provide a control system for ramping a magnetic field of a superconducting magnet that is in thermal contact with a mechanical cryocooler. The control system generally includes a superconducting switch that selectively connects a superconducting magnet to a power supply, and has an open state and a closed state. When in the closed state, the superconducting switch connects the superconducting magnet and the power supply in a connected circuit. The control system also includes a controller programmed to ramp a magnetic field generated by the superconducting magnet from a present magnetic field strength to a target magnetic field strength by selecting a ramp function defining at least one ramp rate; setting a current generated by the power supply to an initial current value; activating the superconducting switch to its closed position, thereby connecting the superconducting magnet and the power supply in the connected circuit; adjusting the current generated by the power supply according to the selected ramp function; and activating the superconducting switch to its open position when the target magnetic field strength is reached, thereby disconnecting the superconducting magnet and the power supply from the connected circuit and placing the superconducting magnet in a closed circuit.

It is another aspect of the invention to provide a method for controlling a ramp-down or a ramp-up of a superconducting magnet. The method includes monitoring at least one operating parameter value indicative of a present state of a superconducting magnet that generates a magnetic field having a present magnetic field strength and determining a ramp function based on the at least one operating parameter value. Instructions are then provided to a controller to ramp the magnetic field generated by the superconducting magnet based on the at least one operating parameter value by selectively activating a superconducting switch to connect the superconducting magnet to a power supply in a connected circuit. When in the connected circuit, a current generated by the power supply is adjusted according to the determined ramp function to adjust the magnetic field generated by the superconducting magnet from the present magnetic field strength to a target magnetic field strength.

It is another aspect of the invention to provide an MRI system whose magnetic field can be rapidly ramped down and up. The MRI system generally includes magnet coils, a power supply, a superconducting switch, a mechanical cryocooler, and a controller. The magnet coils generate a magnetic field and are composed of a superconducting material. The superconducting switch selectively connects the magnet coils to the power supply, and has an open state and a closed state. When in the closed state, the superconducting switch connects the magnet coils and the power supply in a connected circuit. The mechanical cryocooler is in thermal contact with the magnet coils and is operable to reduce and maintain a temperature of the magnet coils below a transition temperature of the superconducting material. The controller programmed to ramp the magnetic field generated by the magnet coils from a present magnetic field strength to a target magnetic field strength by selecting a ramp function defining at least one ramp rate; setting a current generated by the power supply to an initial current value; activating the superconducting switch to its closed position, thereby connecting the magnet coils and the power supply in the connected circuit; adjusting the current generated by the power supply according to the selected ramp function; and activating the superconducting switch to its open position when the target magnetic field strength is reached, thereby disconnecting the magnet coils and the power supply from the connected circuit and placing the magnet coils in a closed circuit.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for rapid magnetic field ramping in a magnetic resonance imaging ("MRI") system that includes a superconducting magnet cooled by a mechanical cryocooler.

Recently, there have been advances in superconductors and superconducting magnet design aimed at reducing the amount of expensive liquid cryogen required to achieve and maintain superconducting properties. These advances include the development of high temperature superconductors that are conductors that become superconducting at temperatures higher than 4 K. Currently, reasonable high temperature superconductors can operate at 10 K; although, some materials can demonstrate superconducting properties at temperatures as high as 30 K. Furthermore, there have been recent proposals on cryogen-free magnet designs that use a cryocooler to cool the magnet coil conductors through thermal contact.

The systems and methods described here are based on a mechanical superconducting magnet design using traditional, or high temperature, superconductors where the main magnetic field can be turned on and off in a short amount of time. For instance, the magnetic field can be turned on and off in an amount of time comparable to a typical amount of time it takes to prepare a subject to be imaged in an MRI system (e.g., about 10-15 minutes).

The MRI system described here uses a mechanical cryocooler that is in thermal contact with the conductors in a superconducting magnet to cool them to temperatures approaching 4 K. Here, thermal contact can include direct or indirect contact, through which thermal energy can be transferred or conducted. The superconducting material used for the magnet design preferably maintains superconducting properties up to temperatures approaching 10 K. In the described system, current density can be added or removed from the conductive windings of the magnet coils in a rapid manner by introducing a power supply source into the circuit (e.g., by means of a superconducting switch). Supplying this current to the magnet coils introduces heat into the system, which can be removed using the thermal cooling capacity of the mechanical cryocooler.

In this system, the rate of current change (and thus the rate of magnetic field change) can be controlled so that the temperature of the conductor does not exceed the superconducting transition point of the magnet coil material. In this manner, there is no rapid resistance changes in the conductor to cause an uncontrolled loss of magnetic field (i.e., a quench). Furthermore, the control system described here provides a simple user interaction for turning the magnetic field on and off, monitors the temperature of the conductors during and after magnetic field ramping, and is capable of adjusting the ramp function or ramp rate, the interval between turning the magnetic field on and off, or both, in order to maintain temperatures that are cold enough to maintain superconducting properties of the magnet coils.

Figure 1:
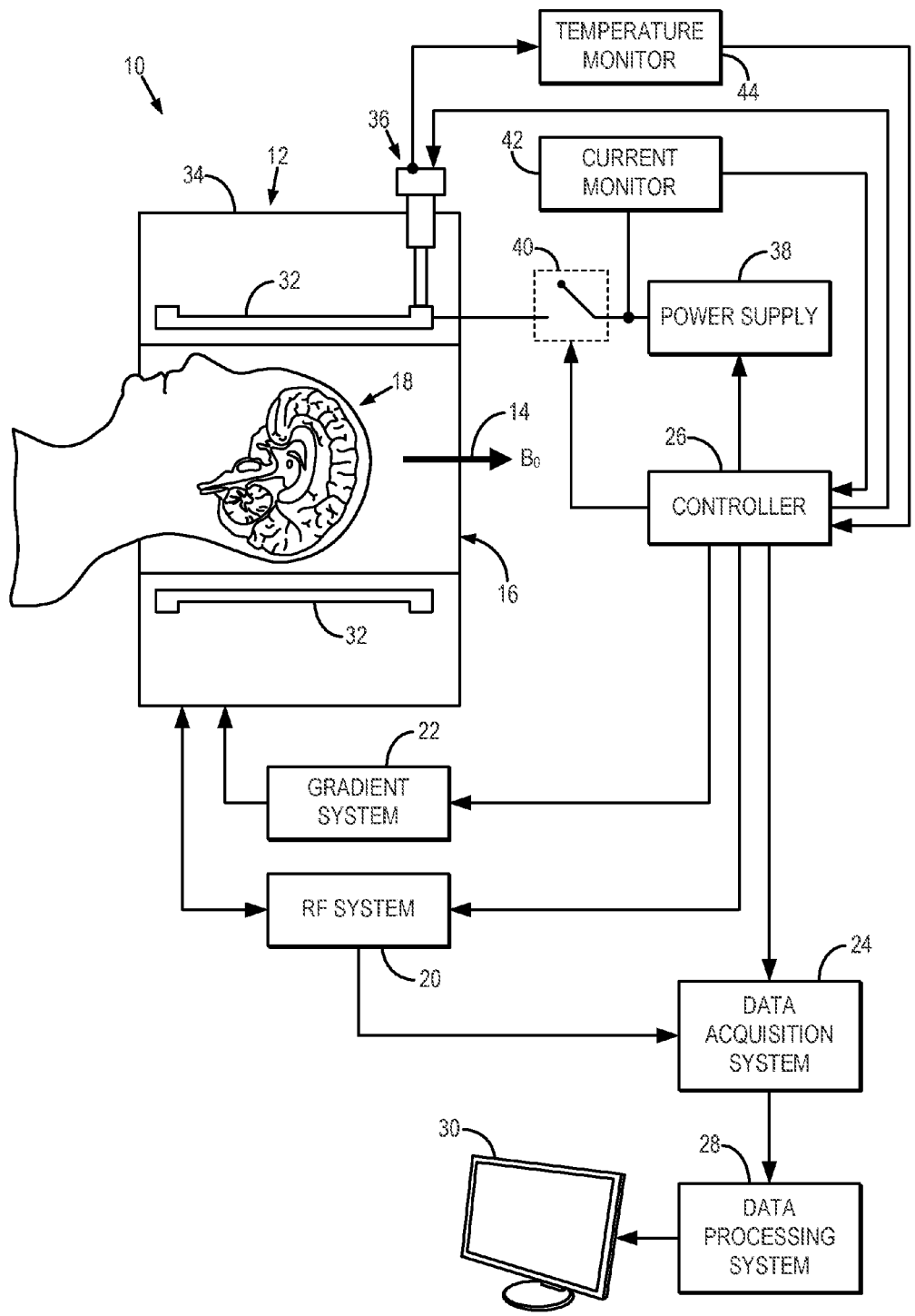
FIG. 1 is a block diagram of an example magnetic resonance imaging ("MRI") system capable of rapid magnetic field ramping.

Referring now to FIG. 1, a magnetic resonance imaging system 10 generally includes a magnet assembly 12 for providing a magnetic field 14 that is substantially uniform within a bore 16 that may hold a subject 18 or other object to be imaged. The magnet assembly 12 supports a radio frequency ("RF") coil (not shown) that may provide an RF excitation to nuclear spins in the object or subject (not shown) positioned within the bore 16. The RF coil communicates with an RF system 20 producing the necessary electrical waveforms, as is understood in the art.

The magnet assembly 12 also supports three axes of gradient coils (not shown) of a type known in the art, and which communicate with a corresponding gradient system 22 providing electrical power to the gradient coils to produce magnetic field gradients, $G_x$, $G_y$, and $G_z$ over time.

A data acquisition system 24 connects to RF reception coils (not shown) that are supported within the magnet assembly 12 or positioned within bore 16.

The RF system 20, gradient system 22, and data acquisition system 24 each communicates with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils 32 housed in a vacuum housing 34, which generally provides a cryostat for the magnet coils 32, and mechanically cooled by a mechanical cryocooler 36, such as a Gifford-McMahon ("GM") cryocooler or a pulse tube cryocooler. In one example configuration, the cryocooler can be a Model RDK-305 Gifford-McMahon cryocooler manufactured by Sumitomo Heavy Industries (Japan). In general, the cryocooler 36 is in thermal contact with the magnet coils 32 and is operable to lower the temperature of the magnet coils 32 and to maintain the magnet coils 32 and a desired operating temperature. In some embodiments the cryocooler 36 includes a first stage in thermal contact with the vacuum housing 34 and a second stage in thermal contact with the magnet coils 32. In these embodiments, the first stage of the cryocooler 36 maintains the vacuum housing 34 at a first temperature and the second stage of the cryocooler 36 maintains the magnet coils 32 at a second temperature that is lower than the first temperature.

The magnet coils 32 are composed of a superconducting material and therefore provide a superconducting magnet. The superconducting material is preferably selected to be a material with a suitable critical temperature such that the magnet coils 32 are capable of achieving desired magnetic field strengths over a range of suitable temperatures. As one example, the superconducting material can be niobium ("Nb"), which has a transition temperature of about 9.2 K. As another example, the superconducting material can be niobium-titanium ("NbTi"), which has a transition temperature of about 10 K. As still another example, the superconducting material can be triniobium-tin ("$Nb_3Sn$"), which has a transition temperature of about 18.3 K.

The choice of superconducting material will define the range of magnetic field strengths achievable with the magnet assembly 12. Preferably, the superconducting material is chosen such that magnetic field strengths in the range of about 0.0 T to about 3.0 T can be achieved over a range of temperatures that can be suitably achieved by the cryocooler 36. In some configurations, however, the superconducting material can be chosen to provide magnetic field strengths higher than 3.0 T.

The cryocooler 36 is operable to maintain the magnet coils 32 at an operational temperature at which the magnet coils 32 are superconducting, such as a temperature that is below the transition, or critical, temperature for the material of which the magnet coils 32 are composed. As one example, a lower operational temperature limit can be about 4 K and an upper operational temperature limit can be at or near the transition, or critical, temperature of the superconducting material of which the magnet coils 32 are composed.

The current density in the magnet coils 32 in the MRI system 10 of the present invention is controllable to rapidly ramp up or ramp down the magnetic field 14 generated by the magnet assembly 12 while controlling the temperature of the magnet coils 32 with the cryocooler 36 to keep the temperature below the transition temperature of the superconducting material of which the magnet coils 32 are composed. As one example, the magnetic field 14 can be ramped up or ramped down on the order of minutes, such as fifteen minutes or less.

In general, the current density in the magnet coils 32 can be increased or decreased by connecting the magnet coils 32 to a circuit with a power supply 38 that is in electrical communication with the magnet coils 32 via a switch 40 and operating the power supply 38 to increase or decrease the current in the connected circuit. The switch 40 is generally a superconducting switch that is operable between a first, closed, state and a second, open, state.

When the switch 40 is in its open state, the magnet coils 32 are in a closed circuit, which is sometimes referred to as a "persistent mode." In this configuration, the magnet coils 32 are in a superconducting state so long as the temperature of the magnet coils 32 is maintained at a temperature at or below the transition temperature of the superconducting material of which they are composed.

When the switch 40 is in the closed state, however, the magnet coils 32 and the power supply 38 can be placed in a connected circuit, and the current supplied by the power supply 38 and the current in the magnet coils 32 will try to equalize. For instance, if the power supply 38 is operated to supply more current to the connected circuit, the current in the magnet coils 32 will increase, which will increase the strength of the magnetic field 14. On the other hand, if the power supply 38 is operated to decrease the current in the connected circuit, the current in the magnet coils 32 will decrease, which will decrease the strength of the magnetic field 14.

It will be appreciated by those skilled in the art that any suitable superconducting switch can be used for selectively connecting the magnet coils 32 and power supply 38 into a connected circuit; however, as one non-limiting example, the switch 40 may include a length of superconducting wire that is connected in parallel to the magnet coils 32 and the power supply 38. To operate such a switch 40 into its closed state, a heater in thermal contact with the switch 40 is operated to raise the temperature of the superconducting wire above its transition temperature, which in turn makes the wire highly resistive compared to the inductive impedance of the magnet coils 32. As a result, very little current will flow through the switch 40. The power supply 38 can then be placed into a connected circuit with the magnet coils 32. When in this connected circuit, the current in the power supply 38 and the magnet coils 32 will try to equalize; thus, by adjusting the current supplied by the power supply 38, the current density in the magnet coils 32 can be increased or decreased to respectively ramp up or ramp down the magnetic field 14. To operate the switch 40 into its open state, the superconducting wire in the switch 40 is cooled below its transition temperature, which places the magnet coils 32 back into a closed circuit, thereby disconnecting the power supply 38 and allowing all of the current to flow through the magnet coils 32.

When the magnet coils 32 are in the connected circuit with the power supply 38, the temperature of the magnet coils 32 will increase as the current in the connected circuit equalizes. Thus, the temperature of the magnet coils 32 should be monitored to ensure that the temperature of the magnet coils 32 remains below the transition temperature for the superconducting material of which they are composed. Because placing the magnet coils 32 into a connected circuit with the power supply 38 will tend to increase the temperature of the magnet coils 32, the rate at which the magnetic field 14 can be ramped up or ramped down will depend in part on the cooling capacity of the cryocooler 36. For instance, a cryocooler with a larger cooling capacity will be able to more rapidly remove heat from the magnet coils 32 while they are in a connected circuit with the power supply 38.

The power supply 38 and the switch 40 operate under control from the controller 26 to provide current to the magnet coils 32 when the power supply 38 is in a connected circuit with the magnet coils 32. A current monitor 42 measures the current flowing to the magnet coils 32 from the power supply 38, and a measure of the current can be provided to the controller 26 to control the ramping up or ramping down of the magnetic field 14. In some configurations, the current monitor 42 is integrated into the power supply 38.

A temperature monitor 44 is in thermal contact with the magnet assembly 12 and operates to measure a temperature of the magnet coils 32 in real-time. As one example, the temperature monitor 44 can include a thermocouple temperature sensor, a diode temperature sensor (e.g., a silicon diode or a GaAlAs diode), a resistance temperature detector ("RTD"), a capacitive temperature sensor, and so on. RTD-based temperature sensors can be composed of ceramic oxynitride, germanium, or ruthenium oxide. The temperature of the magnet coils 32 is monitored and can be provided to the controller 26 to control the ramping up or ramping down of the magnetic field 14.

In operation, the controller 26 is programmed to ramp up or ramp down the magnetic field 14 of the magnet assembly 12 in response to instructions from a user. As mentioned above, the magnetic field 14 can be ramped down by decreasing the current density in the magnet coils 32 by supplying current to the magnet coils 32 from the power supply 38 via the switch 40, which is controlled by the controller 26. Likewise, the strength of the magnetic field 14 can be ramped up by increasing the current density in the magnet coils 32 by supplying current to the magnet coils 32 from the power supply 38 via the switch 40, which is controlled by the controller 26.

The controller 26 is also programmed to monitor various operational parameter values associated with the MRI system 10 before, during, and after ramping the magnetic field 14 up or down. As one example, as mentioned above, the controller 26 can monitor the current supplied to the magnet coils 32 by the power supply 38 via data received from the current monitor 42. As another example, as mentioned above, the controller 26 can monitor the temperature of the magnet coils 32 via data received from the temperature monitor 44. As still another example, the controller 26 can monitor the strength of the magnetic field 14, such as by receiving data from a magnetic field sensor, such as a Hall probe or the like, positioned in or proximate to the bore 16 of the magnet assembly 12.

As will now be described in more detail, the controller 26 can individually or collectively monitor operational parameter values such as the current (I) being supplied to the magnet coils 32, the temperature (T) of the magnet coils 32, and the magnetic field strength ($B_0$) generated by the magnet coils 32, to control the ramping of the magnetic field 14 up or down.

Figure 2:
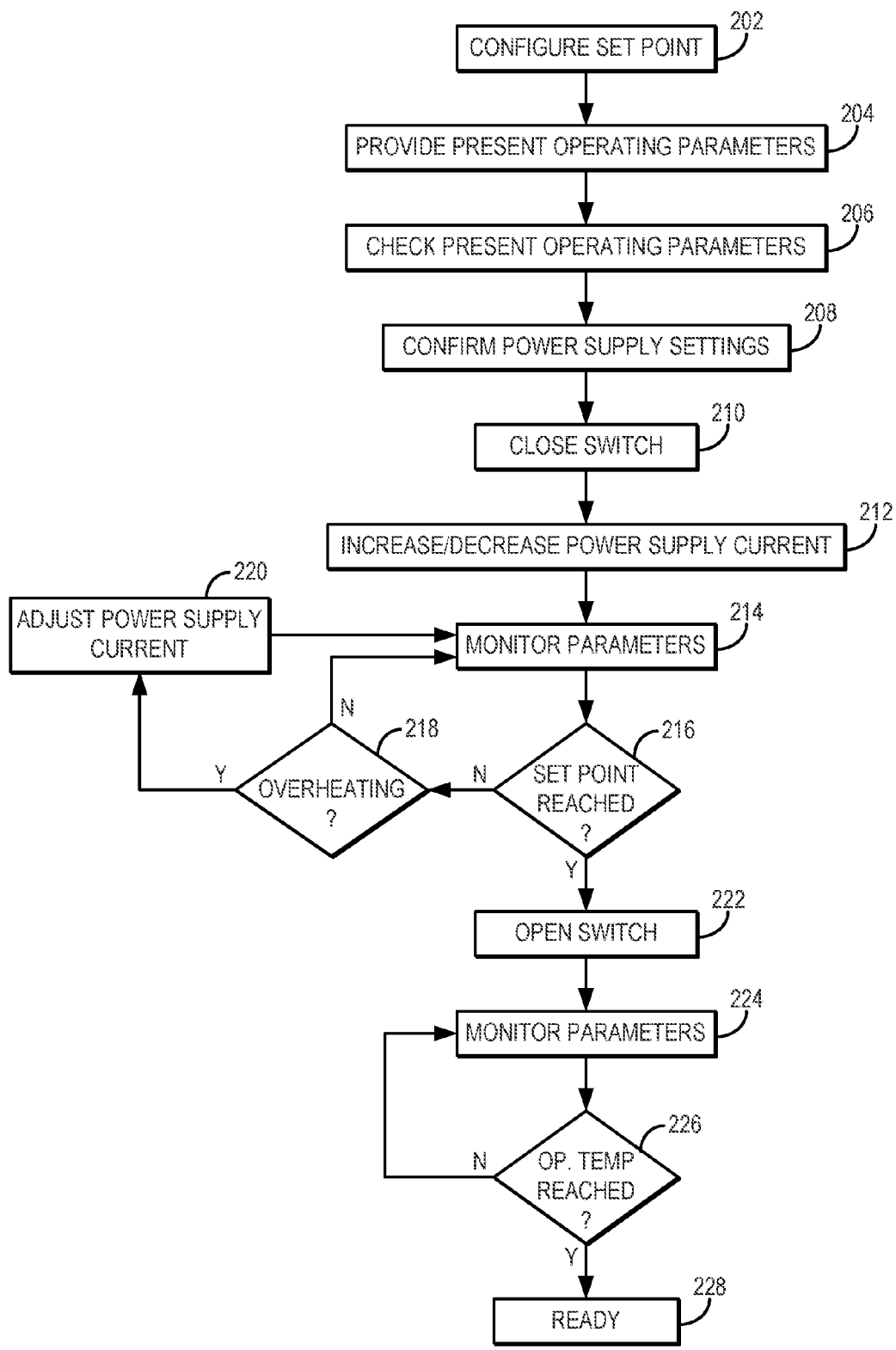
FIG. 2 is a flowchart setting forth the steps of an example method for controlling an MRI system, such as the MRI system of FIG. 1, to rapidly ramp the magnetic field strength of the MRI system.

Referring now to FIG. 2, a flowchart is illustrated as setting forth the steps of an example method for ramping the magnetic field generated by the MRI system descried above with respect to FIG. 1. In general, the magnetic field will be ramped up or down based on a set point that defines a desired magnetic field strength to which the superconducting magnet should be ramped.

To this end, a set point is set by the controller 26, as indicated at step 202. The set point is generally selected based on instructions provided by the user, such as a user-defined, target magnetic field strength to which the superconducting magnet should be ramped. For instance, the user can provide instructions to the controller 26 to ramp the magnetic field strength down to zero from a present magnetic field strength, thereby "turning off" the magnetic field of the MRI system 10. As another example, the user can provide instruction to the controller 26 to ramp down the magnetic field from a first magnetic field strength to a second magnetic field strength that is weaker than the first. For instance, the instructions may be to ramp the magnetic field down from 3.0 T to 1.5 T to implement different imaging applications at the different field strengths. Similarly, the instructions can be to ramp up the magnetic field, such as from 1.5 T to 3.0 T, or from zero field to a desired magnetic field strength.

After the set point has been established, the present operating parameter values associated with the MRI system 10 are provided to the controller 26, as indicated at step 204. Collectively, these operating parameters describe the present state of the MRI system 10, or of components within the MRI system 10, such as the magnet assembly 12 or the magnet coils 32. As one example, the temperature of the magnet coils 32 and the present magnetic field strength can be received by the controller 26.

A check of the present operating parameter values is made at step 206. For instance, the temperature of the magnet coils 32, the present magnetic field strength, or both can be checked to confirm whether the instructions to ramp the magnetic field should be implemented. As one example, if the temperature of the magnet coils 32 is such that it would not be suitable to ramp the magnetic field, then the ramping process is terminated or otherwise placed on hold until the temperature of the magnet coils 32 is appropriately changed. For example, if the temperature of the magnet coils 32 is at or above the upper operational temperature limit (e.g., the critical, or transition, temperature for the magnet coil superconducting material) of the MRI system 10 then it would not be suitable to further increase the temperature of the magnet coils 32 and the magnetic field ramping should be terminated or put on hold until the cryocooler 36 is able to lower the temperature of the magnet coils 32 to a suitable temperature.

A check is then made at step 208 to confirm the present settings of the power supply 38. For instance, the present settings of the power supply 38 are checked to confirm that the current in the power supply 38 is near a target operating current. When ramping up the magnetic field, the target operating current is at or near zero current, and when ramping down the magnetic field, the target operating current is at or near the expected current in the magnet coils 32. If the present current in the power supply 38 is not close to the target operating current, then the settings of the power supply 38 are adjusted to bring the present current to the target operating current.

After confirming the present settings of the power supply 38, the controller 26 sends instructions to operate the switch 40 to its closed state such that current can flow from the power supply 38 to the magnet coils 32, as indicated at step 210. The controller 26 controls the ramping of the magnetic field according to a ramp function that defines at least one ramp rate.

With the switch 40 in its closed state, the power supply 38 and magnet coils 32 are placed into a connected circuit. The current supplied by the power supply 38 is then slowly increased or decreased to respectively ramp up or ramp down the magnetic field, as indicated at step 212. While the magnet coils 32 and power supply 38 are in the connected circuit, the energy change caused by the increase or decrease in the power supply 38 current will generate heat that raises the temperature of the magnet coils 32. Thus, during the ramping process the temperature of the magnet coils 32 is monitored, as indicated at step 214.

As one example, the present temperature of the magnet coils 32 can be measured by the temperature monitor 44 and monitored to confirm whether the temperature of the magnet coils 32 is being maintained within operational limits (e.g., whether the temperature of the magnet coils 32 is being maintained below the transition temperature of the superconducting material of which the magnet coils 32 are composed). In addition to the temperature, other operating parameter values of the MRI system 10 can be monitored, including the magnetic field strength, which can be measured by a Hall probe, or other suitable sensor. The magnetic field strength is preferably monitored to confirm whether a magnetic field set point has been reached. As still another example, the current supplied by the power supply 38 can be measured by the current monitor 42 and monitored to confirm that the appropriate level of current is being supplied to the magnet coils 32.

A determination is made at decision block 216 whether the set point has been reached based on the monitoring of the operating parameters of the MRI system 10. If the set point has not been reached, then monitoring of the operating parameters continues until the set point has been reached. While the operating parameters are being monitored, a determination is also made at decision block 218 whether the magnet coils 32 risk overheating (e.g., being heated near or above the transition temperature) based on the rate at which current is being added or removed from the magnet coils 32. If the temperature of the magnet coils 32 is close to being raised above the transition temperature, then the power supply 38 settings can be adjusted, as indicated at step 220, to temporarily stop changing the current in the connected circuit, or to otherwise slow down the ramp rate. Slowing down, or otherwise stopping, the ramping process will reduce the heating of the magnet coils 32 and allow the cryocooler 36 to lower the temperature of the magnet coils 32 to a more suitable temperature. Once the temperature has been reduced to a more suitable level, the settings of the power supply 38 can again be adjusted to continue increasing or decreasing the current density in the magnet coils 32 until the set point is reached.

When the set point is reached, instructions are sent by the controller 26 to operate the switch 40 to its open state, as indicated at step 222. After the switch 40 is in its open state, the operating parameters of the MRI system 10 are still monitored, as indicated at step 224, until the temperature of the magnet coils 32 is reduced to a suitable temperature for operation, as determined at decision block 226. When the magnet coils 32 reach a stable operating temperature, the MRI system 10 is ready to perform a scan, as indicated at step 228.

Figure 3:
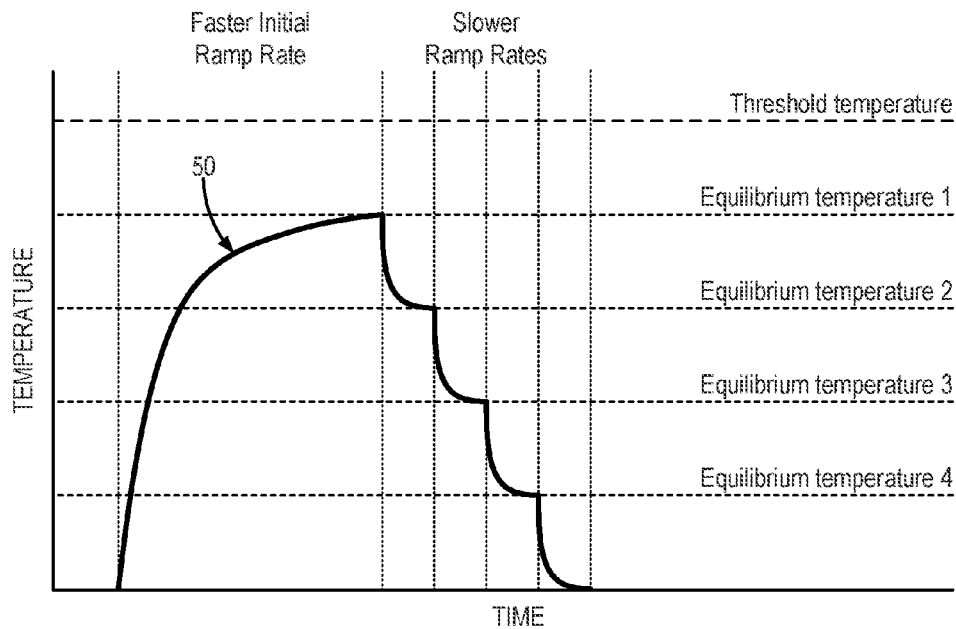
FIG. 3 is an example ramp function that includes a first ramp period during which the temperature of a superconducting magnet is increased to a temperature below a threshold temperature, and a second ramp period during which the temperature of the superconducting magnet is decreased, and wherein the one or more ramp rates defining the second ramp period are slower than the one or more ramp rates defining the first ramp period.
Figure 4:
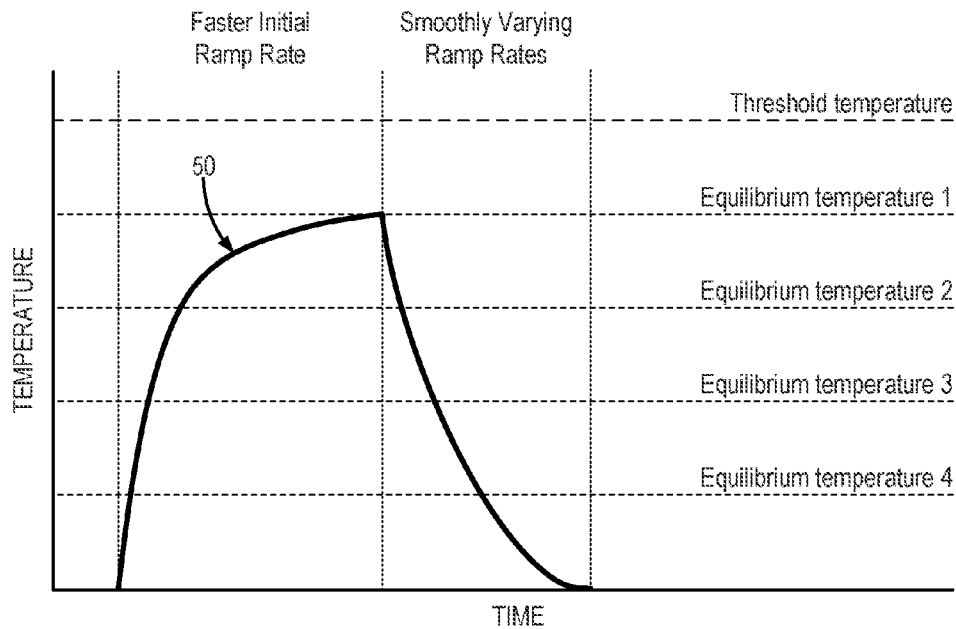
FIG. 4 is another example ramp function that includes a first ramp period during which the temperature of a superconducting magnet is increased to a temperature below a threshold temperature, and a second ramp period during which the temperature of the superconducting magnet is decreased according to a smoothly varying ramp rate that is adjusted based on a derivative of the temperature.

In some embodiments, the ramp function or ramp rate can be user defined. In some other embodiments, the ramp function or ramp rate can be optimized to reduce total ramping time based on the present operating parameters of the MRI system 10 and the set point selected by the user. As shown in FIGS. 3 and 4, the ramp function 50 generally includes a first ramp period during which the temperature of the magnet coils 32 increases to a temperature below a threshold temperature, and a second ramp period during which the temperature of the magnet coils 32 decreases. The first ramp period can be defined by an initial ramp rate, and the second ramp period can be defined by one or more ramp rates that are slower than the initial ramp rate.

Referring particularly now to FIG. 3, the total ramping time can be reduced by using a ramp function 50 that begins with a fast initial ramp rate, such that the equilibrium temperature of the magnet coils 32 at that particular ramp rate does not exceed a predefined threshold temperature. Next, once the magnet coils 32 have reached the equilibrium temperature, or when the current in the magnet coils 32 has reached a predefined level, the ramp rate is decreased by an amount such that the magnet coils 32 will have a new, lower equilibrium temperature. This process can be repeated until the magnet coils 32 are energized with the desired current (i.e., reach the target magnetic field strength).

The initial "fast" ramping period, the individual ramp rates, and the ramp step size can be adjusted such that one of the following effects is achieved: (1) the desired current, and thus the target magnetic field strength, is reached in the smallest amount of time, or (2) the final ramping equilibrium temperature is close, or substantially similar, to the equilibrium temperature of the magnet coils 32 in persistent mode.

Furthermore, as illustrated in FIG. 4, the derivative of the temperature of the magnet coils 32 can be monitored and the ramp function 50 more frequently adjusted in finer ramp rate step sizes, such that the temperature decay curve in the ramp function 50 is smoothly varying. The ramp function or ramp rate can also be controlled during the ramping process based on a monitoring of the operating parameters, as described above.

The present invention has been described in terms of one or more preferred embodiments, and it should be appreciated that many equivalents, alternatives, variations, and modifications, aside from those expressly stated, are possible and within the scope of the invention.

We claim:

1. A control system configured for ramping a magnetic field of a superconducting magnet that is in thermal contact with a mechanical cryocooler, comprising:
    a superconducting switch selectively connecting a superconducting magnet to a power supply and having an open state and a closed state, wherein when in the closed state the superconducting switch connects the superconducting magnet and the power supply in a connected circuit;
    a controller that is programmed to ramp a magnetic field generated by the superconducting magnet from a present magnetic field strength either up to, or down to, a target magnetic field strength by the controller performing each of the following steps:
        (i) receiving, at least one operating parameter value indicative of a present state of the superconducting magnet, wherein the at least one operating parameter value comprises at least one of a temperature of the superconducting magnet and a present magnetic field strength of the superconducting magnet;
        (ii) selecting a ramp function from a plurality of at least two different ramp functions, with the selected ramp function having a first ramp period defining an initial ramp rate and a second ramp period defining at least one additional ramp rate that is different from the initial ramp rate, and wherein the controller is programmed to select the ramp function based on the at least one operating parameter value and the target magnetic field strength;

(iii) setting a current generated by the power supply to an initial current value;

(iv) activating the superconducting switch to its closed position, thereby connecting the superconducting magnet and the power supply in the connected circuit;

(v) receiving from a current monitor a measure of the current being generated by the power supply;

(vi) adjusting the current that is generated by the power supply according to the selected ramp function; and vii) activating the superconducting switch to its open position when the target magnetic field strength is reached, thereby disconnecting the superconducting magnet and the power supply from the connected circuit and placing the superconducting magnet in a closed circuit position.

2. The control system as recited in claim 1, wherein the initial current value is zero, and adjusting the current generated by the power supply when the power supply is in the connected circuit comprises controllably increasing, or ramping up, the current generated by the power supply with respect to the received measure of the current being generated by the power supply.

3. The control system as recited in claim 1, wherein the initial current value is substantially similar to an expected current in the superconducting magnet, and adjusting the current generated by the power supply when the power supply is in the connected circuit comprises decreasing, or ramping down, the current generated by the power supply with respect to the received measure of the current being generated by the power supply.

4. The control system as recited in claim 1, further comprising a temperature monitor in thermal contact with the superconducting magnet so as to measure the temperature of the superconducting magnet while the current is being adjusted according to the selected ramp function.

5. The control system as recited in claim 1, wherein the controller is programmed to select the ramp function in order to minimize a time required to reach the target magnetic field strength, or to ensure that the temperature of the superconducting magnet at the target magnetic field, is substantially similar to an equilibrium temperature of the superconducting magnet when the superconducting magnet is operating in a persistent mode.

6. The control system as recited in claim 5, wherein the selected ramp function comprises the first ramp period during which the temperature of the superconducting magnet increases according to the initial ramp rate and the second ramp period during which the temperature of the superconducting magnet decreases according to the at least one additional ramp rate, and wherein each of the at least one additional ramp rates is slower than the initial ramp rate.

7. A method of controlling a ramping-down or a ramping-up of a superconducting magnet, the steps of the method comprising:

(i) monitoring at least one operating parameter value indicative of a present state of the superconducting magnet that generates a magnetic field having a present magnetic field strength using a sensor that measures the at least one operating parameter value, wherein the at least one operating parameter value comprises at least one of:

a temperature of the superconducting magnet and a present magnetic field strength of the superconducting magnet;

(ii) determining with a controller, a selected ramp function from a plurality of at least two different ramp functions, with the selected ramp function being based on the at least one operating parameter value, wherein the selected ramp function, which is selected from a plurality of at least two different ramp functions, comprises a first ramp period defining an initial ramp rate and a second ramp period defining at least one additional ramp rate, with the initial and additional ramp rate(s) being different from one another;

(iii) utilizing the selected ramp function, as the instructions provided to the controller when ramping the magnetic field generated by the superconducting magnet based on the at least one operating parameter value by selectively activating a superconducting switch and connecting the superconducting magnet to a power supply forming a connected circuit that allows the flow of current; and wherein when the superconducting magnet and the power supply are arranged as a connected circuit, a current generated by the power supply is adjusted according to the selected ramp function in order to adjust the magnetic field generated by the superconducting magnet from the present magnetic field strength either up or down to a target magnetic field strength.

8. The method as recited in claim 7, wherein the ramp function is determined in order to minimize a time required to reach the target magnetic field strength, or to ensure that a temperature of the superconducting magnet at the target magnetic field, is substantially similar to an equilibrium temperature of the superconducting magnet when the superconducting magnet is operating in a persistent mode.

9. A magnetic resonance imaging (MRI) system, comprising:

magnet coils configured for generating a magnetic field, wherein the magnet coils are composed of a superconducting material comprising at least one of niobium, niobium-titanium, or triniobium-tin;

a power supply;

a superconducting switch selectively connecting the magnet coils to the power supply and having an open state and a closed state, wherein when in the closed state the superconducting switch connects the magnet coils and the power supply in a connected circuit;

a mechanical cryocooler in thermal contact with the magnet coils and operable to both reduce and maintain a temperature of the magnet coils below a transition temperature of the superconducting material, wherein the mechanical cryocooler comprises one of a Gifford-McMahon (GM) cryocooler or a pulse tube cryocooler;

a controller that is programmed to ramp a magnetic field generated by the magnet coils from a present magnetic field strength either up to, or down to, a target magnetic field strength by the controller performing each of the following steps:

(i) receiving at least one operating parameter value indicative of a present state of the MRI system, wherein the at least one operating parameter value comprises at least one of a temperature of the magnet coils and a present magnetic field strength of the magnetic field generated by the magnet coils;

(ii) selecting a ramp function from a plurality of at least two different ramp functions, with the selected ramp function having a first ramp period defining an initial ramp rate and a second ramp period defined defining at least one additional ramp rate that is different from the initial ramp rate, and wherein the ramp function is selected by the controller based on the at least one operating parameter value and the target magnetic field strength;

(iii) setting a current generated by the power supply to an initial current value;

(vi) activating the superconducting switch to its closed position, thereby connecting the magnet coils and the power supply in the connected circuit;

(v) receiving from a current monitor a measure of the current being generated by the power supply;

(vi) adjusting the current that is generated by the power supply according to the selected ramp function; and (vii) activating the superconducting switch to its open position when the target magnetic field strength is reached, thereby disconnecting the magnet coils and the power supply from the connected circuit and placing the magnet coils in a closed circuit position.

10. The MRI system as recited in claim 9, wherein the initial current value is zero, and adjusting the current generated by the power supply when the power supply is in the connected circuit comprises controllably increasing, or ramping up the current generated by the power supply with respect to the received measure of the current being generated by the power supply.

11. The MRI system as recited in claim 9, wherein the initial current value is substantially similar to an expected current in the magnet coils, and adjusting the current generated by the power supply when the power supply is in the connected circuit comprises decreasing, or ramping down the current generated by the power supply with respect to the received measure of the current being generated by the power supply.

12. The MRI system as recited in 9, further comprising a temperature monitor in thermal contact with the magnet coils in order to measure the temperature of the magnet coils, and wherein the at least one operating parameter value includes the temperature of the magnet coils.

13. The MRI system as recited in claim 12, wherein the controller is programmed to select the ramp function in order to minimize a time required to reach the target magnetic field strength, or to ensure that a temperature of the superconducting magnet at the target magnetic field, is substantially similar to an equilibrium temperature of the superconducting magnet when the superconducting magnet is operating in a persistent mode.

14. The MRI system as recited in claim 9, further comprising a magnetic field sensor proximate the magnet coils in order to measure the present magnetic field strength of the magnetic field generated by the magnet coils, and wherein the at least one operating parameter value includes the present magnetic field strength.

15. The MRI system as recited in claim 9, further comprising a current monitor in electrical communication with the power supply in order to measure the current generated by the power supply, and wherein the at least one operating parameter value includes the current generated by the power supply.

* * * * *

UNITED STATES PATENT AND TRADEMARK OFFICE
CERTIFICATE OF CORRECTION

PATENT NO. : 10,060,995 B2
APPLICATION NO. : 15/128881
DATED : August 28, 2018
INVENTOR(S) : Jeff A. Stainsby et al.

It is certified that error appears in the above-identified patent and that said Letters Patent is hereby corrected as shown below:

In the Claims

Column 11, Claim 1, Line 15, "vii)" should be --(vii)--.

Column 14, Claim 12, Line 5, "in 9" should be --in claim 9--.

Signed and Sealed this
Thirteenth Day of November, 2018

Andrei Iancu
*Director of the United States Patent and Trademark Office*